(12) United States Patent
van Lengerich et al.

(10) Patent No.: US 11,950,372 B2
(45) Date of Patent: Apr. 2, 2024

(54) METHODS OF MAKING METAL PATTERNS ON FLEXIBLE SUBSTRATE

(71) Applicant: 3M INNOVATIVE PROPERTIES COMPANY, St. Paul, MN (US)

(72) Inventors: Henrik B. van Lengerich, St. Paul, MN (US); Matthew S. Stay, Bloomington, MN (US); Caleb T. Nelson, Woodbury, MN (US); David J. Tarnowski, Mahtomedi, MN (US); David J. Rowe, Roseville, MN (US); Edwin L. Kusilek, Baldwin, WI (US)

(73) Assignee: 3M INNOVATION PROPERTIES, St. Paul, MN (US)

( * ) Notice: Subject to any disclaimer, the term of this patent is extended or adjusted under 35 U.S.C. 154(b) by 559 days.

(21) Appl. No.: 17/252,826

(22) PCT Filed: Jun. 27, 2019

(86) PCT No.: PCT/IB2019/055466
§ 371 (c)(1),
(2) Date: Dec. 16, 2020

(87) PCT Pub. No.: WO2020/003207
PCT Pub. Date: Jan. 2, 2020

(65) Prior Publication Data
US 2021/0161018 A1    May 27, 2021

Related U.S. Application Data

(60) Provisional application No. 62/691,459, filed on Jun. 28, 2018.

(51) Int. Cl.
*H05K 3/00* (2006.01)
*B81C 1/00* (2006.01)
(Continued)

(52) U.S. Cl.
CPC ............ *H05K 3/048* (2013.01); *H05K 1/028* (2013.01); *H05K 3/0014* (2013.01); *H05K 2201/09036* (2013.01); *H05K 2203/0769* (2013.01)

(58) Field of Classification Search
None
See application file for complete search history.

(56) References Cited

U.S. PATENT DOCUMENTS

| 5,772,905 A | 6/1998 | Chou |
| 6,172,810 B1 | 1/2001 | Fleming |

(Continued)

FOREIGN PATENT DOCUMENTS

| JP | 2010238626 | 10/2010 |
| JP | 2010238626 A * | 10/2010 |

(Continued)

OTHER PUBLICATIONS

Chou, Y Stephen et al. "Nanoimprint lithography", Journal of Vacuum Science & Technology B: Microelectronics and Nanometer Structures Processing, Measurement, and Phenomena, 1996, vol. 14, No. 6, pp. pp. 4129.

(Continued)

*Primary Examiner* — Shamim Ahmed
(74) *Attorney, Agent, or Firm* — Thomas M. Spielbauer

(57) ABSTRACT

Methods of making metal patterns on flexible substrates are provided. Releasable solid layer is selectively formed on a patterned surface of the flexible substrate by applying a liquid solution thereon. Metal patterns on the flexible substrate can be formed by removing the releasable solid layer (Continued)

after metallization. In some cases, the releasable solid layer can be transferred from the patterned surface to a transfer layer where the metal patterns are formed.

7 Claims, 8 Drawing Sheets

(51) Int. Cl.
 *H05K 1/02* (2006.01)
 *H05K 3/04* (2006.01)

(56) References Cited

U.S. PATENT DOCUMENTS

| | | | |
|---|---|---|---|
| 6,719,915 B2 | 4/2004 | Wilson | |
| 8,263,129 B2 | 9/2012 | DeSimone | |
| 8,460,568 B2 | 6/2013 | David | |
| 8,623,140 B2 | 1/2014 | Yapel | |
| 8,703,232 B2 | 4/2014 | Stay | |
| 9,759,663 B2 | 9/2017 | Halverson | |
| 2005/0266355 A1* | 12/2005 | Matsui | G03F 7/094 430/323 |
| 2010/0266965 A1* | 10/2010 | Schmid | B82Y 40/00 430/323 |
| 2011/0111182 A1* | 5/2011 | Stay | C23C 18/1608 428/173 |
| 2013/0306359 A1 | 11/2013 | Frey | |
| 2014/0197510 A1* | 7/2014 | Ho | H01L 31/085 257/432 |
| 2014/0210749 A1 | 7/2014 | Park et al. | |
| 2015/0004438 A1* | 1/2015 | Takizawa | G11B 5/855 205/70 |
| 2015/0034104 A1 | 2/2015 | Zhou | |
| 2017/0142841 A1 | 5/2017 | Stay | |
| 2021/0219433 A1* | 7/2021 | Shino | B41M 5/52 |

FOREIGN PATENT DOCUMENTS

| | | |
|---|---|---|
| WO | WO 2015-035556 | 3/2015 |
| WO | WO 2015-035960 | 3/2015 |
| WO | WO 2018-005109 | 1/2018 |

OTHER PUBLICATIONS

Haisma, "Mold assisted nanolithography: A process for reliable pattern replication", Journal of Vacuum Science & Technology B: Microelectronics and Nanometer Structures Processing, Measurement, and Phenomena, 1996, vol. 14, No. 6, pp. 4124 (1996).

Jung, "Lift-off process using bilayer ultraviolet nanoimprint lithography and methacryloxypropyl-terminated-polydimethylsiloxane-based imprint resin", Journal of Vacuum Science & Technology B: Microelectronics and Nanometer Structures Processing, Measurement, and Phenomena, 2009, vol. 27, No. 4, pp. 1861-1864.

Kim, "Solvent-assisted microcontact molding: A convenient method for fabricating three-dimensional structures on surfaces of polymers", Advanced Materials, 1997, vol. 9, No. 8, pp. 651-654.

Nakamatsu, "Nanoimprint and Lift-Off Process Using Poly(vinyl alcohol)", Japanese Journal of Applied Physics, Nov. 2005, vol. 44, No. 11, pp. 8186-8188.

Park, "Nanoscale Patterning and Electronics on Flexible Substrate by Direct Nanoimprinting of Metallic Nanoparticles", Advanced Materials, Feb. 2008, vol. 20, No. 3, pp. 489-496.

Suh, "Capillary force lithography", Advanced Materials, Sep. 2001, vol. 13, No. 18, pp. 1386-1389.

Weidner, "Role of surface tension gradients in correcting coating defects in corners", Journal of Colloid and Interface Science, Apr. 1996, vol. 179, No. 1, pp. 66-75.

International Search Report for PCT International Application No. PCT/IB2019/055466, dated Nov. 11, 2019, 3 pages.

* cited by examiner

METHODS OF MAKING METAL PATTERNS ON FLEXIBLE SUBSTRATE

CROSS REFERENCE TO RELATED APPLICATIONS

This application is a national stage filing under 35 U.S.C. 371 of PCT/IB2019/055466, filed Jun. 27, 2019, which claims the benefit of U.S. Application No. 62/691,459, filed Jun. 28, 2018, the disclosure of which is incorporated by reference in its/their entirety herein.

TECHNICAL FIELD

The present disclosure relates to methods of making metal patterns/features on a flexible substrate, and the devices made by the same.

BACKGROUND

Metal patterns can be made on a substrate by various techniques. For example, in one typical process, a poly(methyl methacrylate) (PMMA) can be first patterned on a substrate by a thermal imprint lithography process followed by reactive-ion etching; a metal was then deposited onto the entire surface; the PMMA along with the metal thereon was washed away with acetone; and only the metal that was deposited onto the substrate remains. Typical thermal imprint lithography processes were described in, e.g., U.S. Pat. No. 5,772,905 (Chou et al.). In another typical process, polyvinyl alcohol (PVA) resin instead of PMMA was used so that water could be used for the wash-off step.

SUMMARY

Briefly, in one aspect, the present disclosure describes a method of forming a metal pattern on a flexible substrate. The method includes providing a patterned surface on the flexible substrate. The patterned surface includes one or more recessed features and one or more plateau features adjacent to the recesses. The method further includes coating the patterned surface with a liquid solution to at least partially fill the recessed features, solidifying the liquid solution to form a releasable solid layer in the recessed features, etching the patterned surface after solidifying the liquid solution, providing a metal layer to cover the patterned surface, and removing the solid layer along with the metal layer thereon in the recessed features from the flexible substrate to form a metal pattern on the plateau features of the flexible substrate.

In another aspect, the present disclosure describes a device made according to the above method. The device includes the metal pattern disposed only on a top surface of the plateau features. The plateau features have an average line width of about 50 nm to about 5 microns, and an average height of about 50 nm to about 5 microns.

In another aspect, the present disclosure describes a method of forming a metal pattern. The method includes providing a patterned surface including one or more recessed features and one or more plateau features adjacent to the recesses, coating the patterned surface with a liquid solution to at least partially fill the recesses, solidifying the liquid solution to form a releasable solid layer in the recesses, providing a transfer layer to adhere to the patterned surface, and removing the transfer layer from the patterned surface to form a patterned construction on the transfer layer. The solid layer is transferred from the patterned surface to the transfer layer and forms one or more plateau features of the patterned construction. The method further comprises providing a metal layer on the patterned construction of the transfer layer, and removing the solid layer along with the metal layer thereon from the pattern construction to form a metal pattern on the transfer layer.

In another aspect, the present disclosure describes a device made according to the above method. The device includes the transfer layer having a patterned surface including one or more recessed features and one or more plateau features adjacent to the recesses; and the metal pattern disposed only in the recessed features. The recessed features have an average line width of about 50 nm to about 5 microns, and an average depth of about 50 nm to about 5 microns.

Various unexpected results and advantages are obtained in exemplary embodiments of the disclosure. One such advantage of exemplary embodiments of the present disclosure is that a liquid solution can uniformly coat on a patterned surface. After solidification of the liquid solution, a releasable solid layer can be selectively formed on the patterned surface for an effective lift-off process after metallization.

Various aspects and advantages of exemplary embodiments of the disclosure have been summarized. The above Summary is not intended to describe each illustrated embodiment or every implementation of the present certain exemplary embodiments of the present disclosure. The Drawings and the Detailed Description that follow more particularly exemplify certain preferred embodiments using the principles disclosed herein.

BRIEF DESCRIPTION OF THE DRAWINGS

The disclosure may be more completely understood in consideration of the following detailed description of various embodiments of the disclosure in connection with the accompanying figures, in which.

Figure 1A:
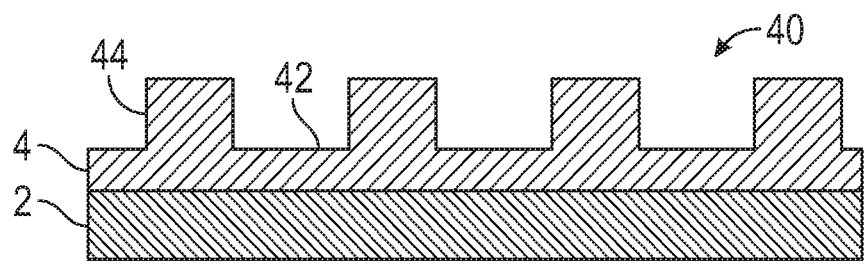
FIG. 1A is a cross-sectional view of a flexible substrate having a patterned surface, according to one embodiment.

In the drawings, like reference numerals indicate like elements. While the above-identified drawing, which may not be drawn to scale, sets forth various embodiments of the present disclosure, other embodiments are also contemplated, as noted in the Detailed Description. In all cases, this disclosure describes the presently disclosed disclosure by way of representation of exemplary embodiments and not by express limitations. It should be understood that numerous other modifications and embodiments can be devised by those skilled in the art, which fall within the scope and spirit of this disclosure.

DETAILED DESCRIPTION

For the following Glossary of defined terms, these definitions shall be applied for the entire application, unless a different definition is provided in the claims or elsewhere in the specification.

GLOSSARY

Certain terms are used throughout the description and the claims that, while for the most part are well known, may require some explanation. It should be understood that:

By using terms of orientation such as "atop", "on", "over," "covering", "uppermost", "underlying" and the like for the location of various elements in the disclosed coated articles, we refer to the relative position of an element with respect to a horizontally-disposed, upwardly-facing substrate. However, unless otherwise indicated, it is not intended that the substrate or articles should have any particular orientation in space during or after manufacture.

By using the term "overcoated" to describe the position of a layer with respect to a substrate or other element of an article of the present disclosure, we refer to the layer as being atop the substrate or other element, but not necessarily contiguous to either the substrate or the other element.

By using the term "separated by" to describe the position of a layer with respect to other layers, we refer to the layer as being positioned between two other layers but not necessarily contiguous to or adjacent to either layer.

The terms "about" or "approximately" with reference to a numerical value or a shape means+/−five percent of the numerical value or property or characteristic, but expressly includes the exact numerical value. For example, a viscosity of "about" 1 Pa-sec refers to a viscosity from 0.95 to 1.05 Pa-sec, but also expressly includes a viscosity of exactly 1 Pa-sec. Similarly, a perimeter that is "substantially square" is intended to describe a geometric shape having four lateral edges in which each lateral edge has a length which is from 95% to 105% of the length of any other lateral edge, but which also includes a geometric shape in which each lateral edge has exactly the same length.

The term "substantially" with reference to a property or characteristic means that the property or characteristic is exhibited to a greater extent than the opposite of that property or characteristic is exhibited. For example, a substrate that is "substantially" transparent refers to a substrate that transmits more radiation (e.g. visible light) than it fails to transmit (e.g. absorbs and reflects). Thus, a substrate that transmits more than 50% of the visible light incident upon its surface is substantially transparent, but a substrate that transmits 50% or less of the visible light incident upon its surface is not substantially transparent.

As used in this specification and the appended embodiments, the singular forms "a", "an", and "the" include plural referents unless the content clearly dictates otherwise. Thus, for example, reference to fine fibers containing "a compound" includes a mixture of two or more compounds. As used in this specification and the appended embodiments, the term "or" is generally employed in its sense including "and/or" unless the content clearly dictates otherwise.

As used in this specification, the recitation of numerical ranges by endpoints includes all numbers subsumed within that range (e.g. 1 to 5 includes 1, 1.5, 2, 2.75, 3, 3.8, 4, and 5).

Unless otherwise indicated, all numbers expressing quantities or ingredients, measurement of properties and so forth used in the specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

Various exemplary embodiments of the disclosure will now be described with particular reference to the Drawings. Exemplary embodiments of the present disclosure may take on various modifications and alterations without departing from the spirit and scope of the disclosure. Accordingly, it is to be understood that the embodiments of the present disclosure are not to be limited to the following described exemplary embodiments, but are to be controlled by the limitations set forth in the claims and any equivalents thereof.

FIG. 1A is a cross-sectional view of a flexible substrate having a patterned surface, according to one embodiment. The patterned surface 40 is formed on a major surface of the flexible substrate 2. The patterned surface 40 includes one or more recessed features 42 and one or more plateau features 44 adjacent to the recessed features 42. In some embodiments, the plateau features 44 may form a mesh configuration such as the mesh 52 shown in FIG. 7. A mesh described herein is typically understood to mean a pattern geometry having connected traces that are separated by open areas 54 to form cells. Illustrative examples of meshes with linear traces include, for example, those having hexagonal and square cells. In some embodiments, the open area of the mesh can be, for example, greater than 90%, greater than 95%, or greater than 98%. The plateau features 44 can have an average line width in a range, for example, about 50 nm to about 5 microns, or about 100 nm to about 3 microns; and an average height in a range, for example, about 50 nm to about 5 microns, or about 100 nm to about 3 microns.

In some embodiments, the substrate 2 can be a flexible substrate, for example, a web of indefinite length polymeric material. The flexible substrate or web may be stretched (e.g., along a machine direction and/or a cross direction) when moving along a web path. The flexible substrate may include, for example, polyethylene terephthalate (PET), polyethylene, polystyrene, polyurethane, etc. The processes described herein can be carried out on a roll-to-roll apparatus including one or more rollers to convey the web along the web path. The substrate 2 may have a thickness of, for example, about 2 mm or less, about 1 mm or less, about 500 microns or less, or about 200 microns or less.

In some embodiments, the patterned surface 40 can be directly formed on the flexible substrate 2. In the depicted embodiment of FIG. 1A, the patterned surface 40 is formed on a patterned layer 4 that is disposed on the substrate 2.

In some embodiments, the patterned surface 40 can be formed on the substrate 2 by a micro-replication process. In some embodiments, a layer of curable material can be provided onto the substrate 2 to form the patterned layer 4. The curable material may include, for example, polydimethylsiloxane (PDMS), epoxy, UV-curable acrylate resin, etc. A micro-replication stamp can be provided to press against the layer of curable material to create replicated features thereon. The curable material can be cured with various methods including, e.g., thermal, UV, e-beam radiation, etc. It is to be understood that the patterned surface 40 can be formed on the substrate 2 by any suitable methods such as, for example, embossing, micro-molding, micro-matching, laser etching, 3D printing, etc.

In some embodiments, the patterned layer 4 can include one or more release coating materials that exhibit a relatively low surface adhesion strength. Such release coating materials can include, for example, siloxanes, silicones, polytetrafluoroethylene, etc.

Figure 1B:
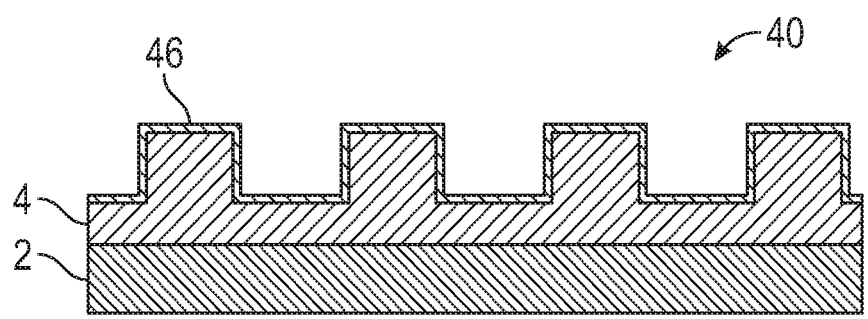
FIG. 1B illustrates a process of treating the patterned surface of FIG. 1A to form a release coating thereon, according to one embodiment.

In some embodiments, the patterned surface 40 can be treated to lower the surface adhesion strength thereof. In the depicted embodiment of FIG. 1B, the patterned surface 40 of FIG. 1A is treated to form a release coating 46 thereon, according to one embodiment. In some embodiments, the release coating 46 can be formed by a plasma deposition process. A gaseous hexamethyldisiloxane (HMDSO) can be introduced into a reaction chamber, and in the presence of a plasma to form a release coating on the patterned surface 40. The release coating may have a thickness, for example, less than about 500 nm, less than about 200 nm, or less than 100 nm. An exemplary plasma deposition process and apparatus is described in WO 2018/005109 (Yu et al,), which is incorporated herein by reference.

Figure 1C:
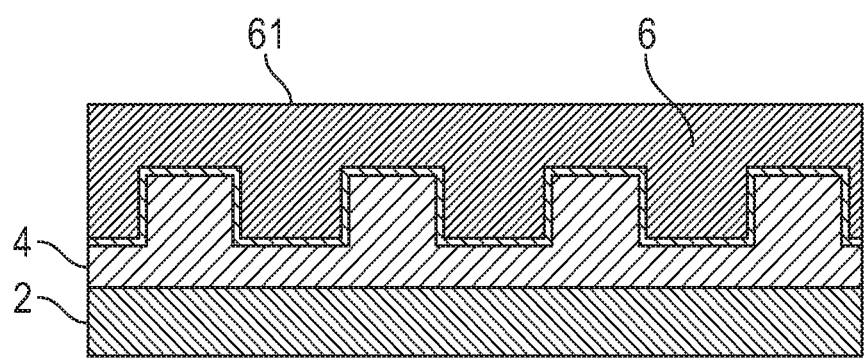
FIG. 1C illustrates a process of coating a liquid solution onto the patterned surface of FIG. 1B, according to one embodiment.

A liquid solution can be provided onto the patterned surface 40 to selectively form a releasable solid layer thereon. In the embodiment of FIG. 1C, after the formation of the release coating 46, a liquid solution 6 is provided onto the patterned surface 40. The liquid solution 6 fills in the recessed features 42 and covers the plateau features 44. In the depicted embodiment of FIG. 1C, the liquid solution 6 has a surface level 61 that is higher than the plateau features 44. It is to be understood that in some embodiments, the liquid solution 6 may have the surface level 61 lower than the plateau features 44 and be present only in the recessed features 42.

In some embodiments, the liquid solution 6 may be a solution of poly(vinyl alcohol) (PVA) in water. It is to be understood that the liquid solution may include other solutes such as, for example, Polyvinyl butyral (PVB), curable acrylate, film formers, etc. The liquid solution can be solubilized in any combination of common solvents such as water, isopropyl alcohol, methyl ethyl ketone, hexanes, ethyl acetate. The surface energy of the liquid composition can be modified by adding surfactants such as, for example, Polyethylene glycol p-(1,1,3,3-tetramethylbutyl)-phenyl ether (commercially available from Sigma-Aldrich Chemical company, Milwaukee, WI under the trade name Triton™ X-100).

The liquid solution 6 is then solidified to form a releasable solid layer 62 in the recessed features 42. In some embodiments, the liquid solution 6 can be solidified by drying at a temperature, for example, about 25° C. to about 175° C., or about 50° C. to about 100° C. The patterned surface 40 has a relative low surface adhesion strength such that the solid layer 62 is separable or releasable from the recessed features 42, for example, by peeling or washing. In the depicted embodiment of FIG. 1D, a solidifying product residue 64 remains on the plateau features 44 after the solidifying. The solidifying product residue 64 has a dry thickness thinner that of the solid layer 62 in the recessed features. In some embodiments, the solidifying product residue 64 may have a dry thickness, for example, about ½ or less, about ⅓ or less, about ⅕ or less, or about 1/10 or less of the dry thickness of solid layer 62 in the recessed features.

In the depicted embodiment, the plateau features 44 each have a planar top surface. In some embodiments, the plateau features 44 can have various protrusive shapes such as, for example, a prismatic or pyramidal shape, a hemispherical shape, a bullet-like shape, etc. Various protrusive features were described in U.S. Pat. No. 8,703,232 (Stay et al.), which is incorporated herein by reference. In some embodiments, the plateau features 44 may have a protrusive shape that allows the liquid solution 6 to flow from the plateau features into the recessed features 42 to reduce the amount of solidifying product residue 64 on the plateau features 44. In some embodiments, the plateau features 44 may have hydrophobic surface characteristics that repel the liquid solution 6 to flow from the plateau features into the recessed features.

After the formation of the releasable solid layer 62 in the recessed features, an electrically conductive layer can be provided onto the patterned surface. The electrically conductive layer can be, for example, a metal layer, or include any suitable electrically conductive materials. FIG. 2A illustrates a process of providing a metal layer 8 to cover the patterned surface of FIG. 1D, according to one embodiment. A first portion 82 of the metal layer 8 is disposed in the recessed features 42; and a second portion 84 of the metal layer 8 is disposed on the top surface of plateau features 44.

The layer of metal 8 can be formed by any desired processes including, for example, evaporating, sputtering, e-beam deposition, physical vapor deposition, chemical vapor deposition, liquid coating, etc. In some embodiments, the metal layer may include multiple layers, for example, including a tie-layer to be in direct contact to the patterned surface, and a layer of another metal (e.g., copper, silver, gold, aluminum, etc.) on top of the tie-layer. The tie-layer, also known as a glue or adhesion promoting layer can include chromium, chromium oxide, ITO, AZO, nickel, titanium, etc. It is to be understood that the metal layer may include any suitable electrically conductive materials.

In some embodiments, the metal layer 8 can have an average thickness of, for example, about 0.01 to about 2 micrometers, about 0.02 to about 1 micrometer, or about 0.025 to about 0.5 micrometers. In some embodiments, the metal layer 8 can be continuous, have one or more surfaces conformal with the surface morphology of the patterned surface, and have a generally uniform thickness. In some embodiments, the metal layer 8 may have a non-uniform thickness. For example, as illustrated in FIG. 2A, the metal layer 8 at the step 66 may have a decreased thickness or even be discontinued.

Figure 2A:
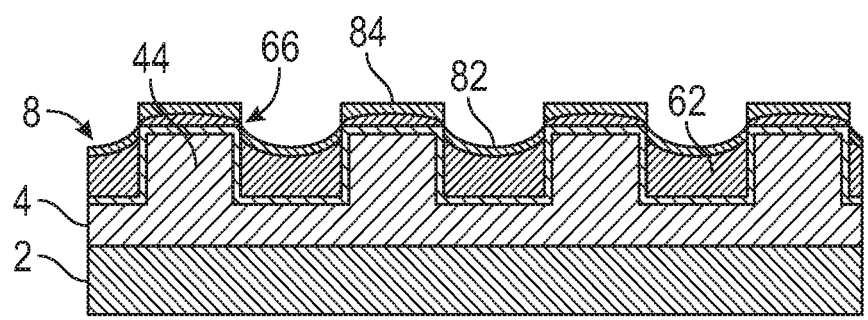
FIG. 2A illustrates a process of providing a metal layer onto the patterned surface of FIG. 1D, according to one embodiment.
Figure 2B:
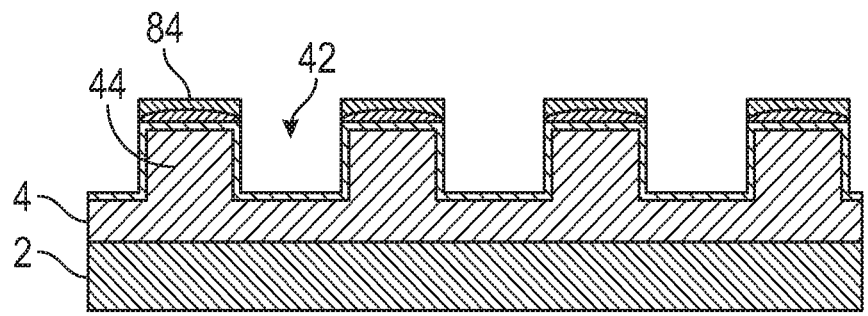
FIG. 2B illustrates a process of removing the solid layer along with the metal layer thereon of FIG. 2A, according to one embodiment.

After the formation of metal layer on the patterned surface, a lift-off process can be performed to remove the releasable solid layer 62 in the recessed features along with the metal layer 82 thereon from the patterned surface. The remaining metal layer 84 on the patterned surface 40 forms a metal pattern, as shown in FIG. 2B.

In some embodiments, the solid layer 62 can be a water-soluble polymer layer that can be removed from the patterned surface 40 by, for example, pressure washing, ultrasonic washing, etc. When the solid layer 62 includes poly (vinyl alcohol) (PVA), the solid layer 62 can be dissolved and released from the substrate by water washing. In some embodiments, the solid layer 62 can be removed by peeling. In one embodiment, a curable resin layer, for example, an acylate resin, can be overcast on the patterned surface 40. The curable resin layer can be cured and peeled from the patterned surface 40 along with the metal layer and the releasable solid layer in the recessed features. The curable resin material can have a suitable affinity to the metal layer such that the metal layer on top of the plateaus can remain on the patterned surface, while the releasable solid layer can be removed along with the metal layer thereon. In some embodiments, the metal layer can be applied in a manner such that it adheres more strongly to the patterned surface, such as, for example, deposition using sputtering and/or using a tie layer.

It is to be understood that the releasable solid layer 62 can be any appropriate resist layer that can be removed from the patterned surface 40 by applying, for example, a solvent, heat, cooling, peeling, etc. In some embodiments, the release coating 46 underneath the solid layer 62 in the recessed features can be completely or partially removed along with the solid layer 62.

Figure 3A:
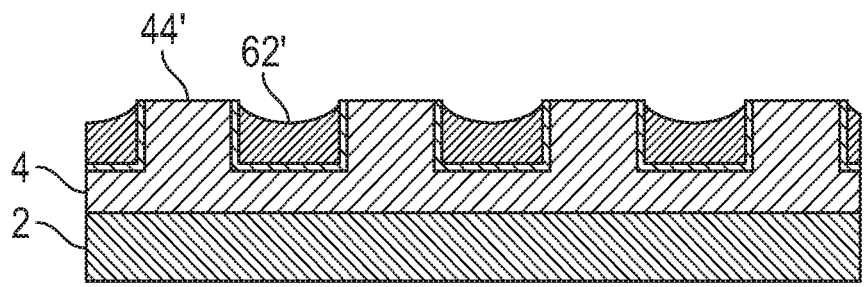
FIG. 3A illustrates a process of etching the patterned surface of FIG. 1D, according to one embodiment.

In some embodiments, the solidifying product residue 64 remaining on the plateau features 44 after the solidifying (see, e.g., FIG. 1D) can be removed before providing a metal layer on the plateau features. In the depicted embodiment of FIG. 3A, the residue 64 has been removed from the plateau features 44' by etching. Any suitable etching processes can be used, including, for example, reactive ion etching (RIE) such as oxygen or octofluoropropane plasma etching. After the removing of the solidifying product residue 64 from the plateau features 44, the etching process can continue to remove the underneath release coating 46 (see FIG. 1B) to expose the top surface of the plateau features 44. In some embodiments, the RIE can remove the solidifying product residue and then modify the chemistry of the underneath release coating 46. The etching may also slightly reduce the thickness of the solid layer 62' in the recessed features. In some embodiments, the thickness of the solid layer 62' can be reduced by, e.g., less than 20%, less than 10%, or less than 5%.

The etching process used herein can be used to modify the chemistry of the release coating 46 (on the plateau features). Such modification can be beneficial for improving the adhesion of a metal layer disposed thereon. The etching process used herein can be well controlled such that it may not cause cross-linking in the releasable solid layer which may cause the solid layer to adhere more strongly to the substrate and be less soluble in water. The processes described herein can be technically advantageous over the traditional thermal imprint lithography process such as described in U.S. Pat. No. 5,772,905 (Chou et al.), where a heavy reactive-ion etching process may deteriorate the substrate surface and the thereafter formed metal/substrate interface.

Figure 3B:
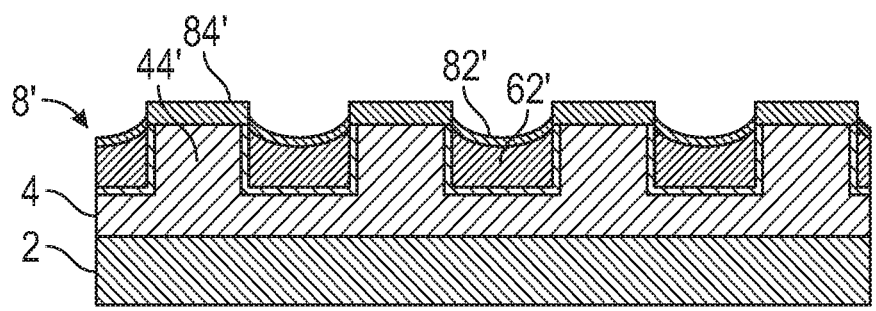
FIG. 3B illustrates a process of providing a metal layer onto the patterned surface of FIG. 3A, according to one embodiment.
Figure 3C:
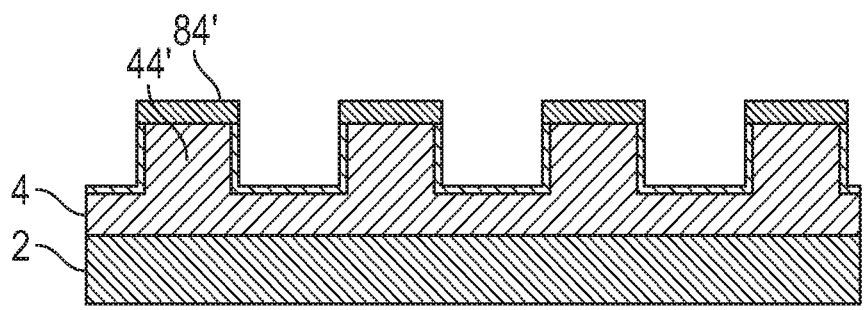
FIG. 3C illustrates a process of removing the solid layer along with the metal layer thereon of FIG. 3B, according to one embodiment.

After the etching, an electrically conductive layer can be provided onto the patterned surface. FIG. 3B illustrates a process of providing a metal layer 8' to cover the patterned surface of FIG. 3A, according to one embodiment. A first portion 82' of the metal layer 8' is disposed on the releasable solid layer 62' in the recessed features; and a second portion 84' of the metal layer 8' is directly disposed on the top surface of plateau features 44'. A lift-off process can be performed to remove the solid layer 62' in the recessed features along with the metal layer 82' thereon. FIG. 3C is a cross-sectional view of the metal pattern 84' on the plateau features 44'.

Figure 1D:
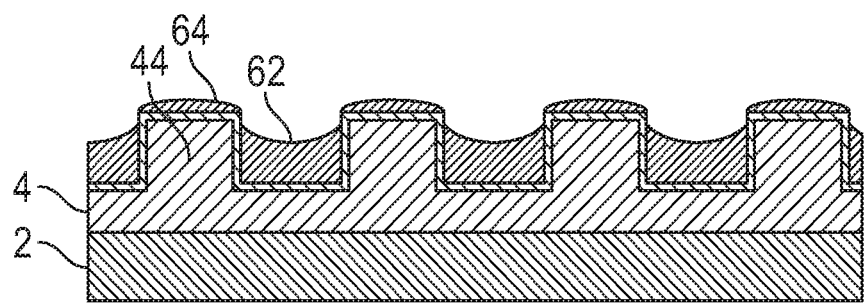
FIG. 1D illustrates a process of drying the liquid solution of FIG. 1C to form a solid layer, according to one embodiment.
Figure 4A:
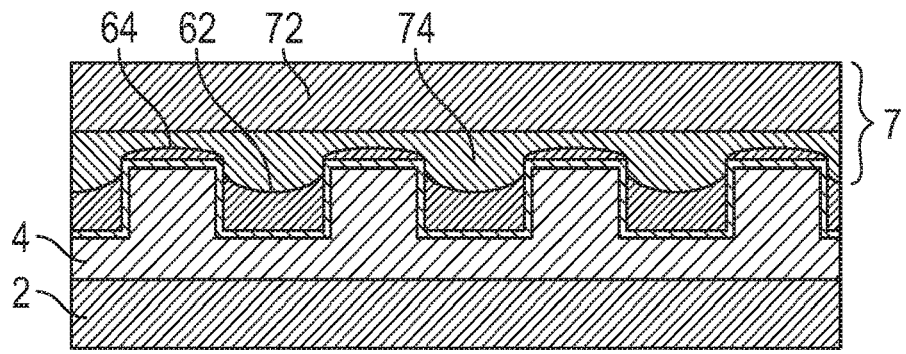
FIG. 4A illustrates a process of providing a transfer layer onto the patterned surface of FIG. 1D, according to one embodiment.

In some embodiments, a patterned surface covered with selectively formed, releasable solid layer such as the structure shown in FIG. 1D can be used as a molding surface to make metallized patterns. It is to be understood that the patterned surface can be made of other suitable materials such as, for example, metal. FIG. 4A illustrates a process of providing a transfer layer onto the patterned surface of FIG. 1D, according to one embodiment. In some embodiments, the solidifying product residue 64 remaining on the plateau features 44 after the solidifying (see, e.g., FIG. 1D) can be removed before providing a transfer layer thereon, such as the embodiment depicted in FIG. 3A.

The transfer layer 7 includes an adhesive layer 74 in direct contact to the patterned surface of the patterned layer 4. The adhesive layer 74 is supported by a flexible backing layer 72. In some embodiments, the adhesive layer 74 can be formed by providing a curable liquid onto the patterned surface to form a cured product. In some embodiments, the adhesive layer can be at least partially formed by resolubilizing the releasable solid layer 62, and using the resolubilized layer as at least a portion of the adhesive layer. The adhesive layer can also be solvent coated onto the backing 72 or on top of the patterned surface.

The layer of adhesive 74 can include any suitable adhesive materials having the desired properties. The layer of adhesive 74 can be peelable or stretch releasable and peelable from the patterned surface of the substrate 2. In some embodiments, the adhesive can include at least one of rubber, silicone, or acrylic based adhesives. In some embodiments, the adhesive can include tackified rubber adhesives, such as natural rubber; olefins; silicones, such as silicone polyureas or silicone block copolymers; synthetic rubber adhesives such as polyisoprene, polybutadiene, and styrene-isoprene-styrene, styrene-ethylene-butylene-styrene and styrene-butadiene-styrene block copolymers, and other synthetic elastomers; and tackified or untackified acrylic adhesives such as copolymers of isooctylacrylate and acrylic acid, which can be polymerized by radiation, solution, suspension, or emulsion techniques; polyurethanes; silicone block copolymers; and combinations of the above. The adhesive can be, for example, any of the adhesives described in any of the following patent applications, all of which are incorporated by reference herein: PCT Patent Publication Nos. 2015/035556, 2015/035960, and U.S. Patent Publication NO. 2015/034104.

In some embodiments, the backing layer 72 may have sufficient flexibility so that the transfer layer 7 can provide conformability and resiliency properties which are helpful when the adhesive layer 74 is adhered to the patterned surface of the patterned layer 7 and when it is removed therefrom by peeling. In some embodiments, the flexible backing layer 72 can include a flexible polymeric film. The flexible backing layer 72 may include, for example, polyethylene terephthalate (PET), polyethylene, polystyrene, polyurethane, etc. The processes described herein can be carried out on a roll-to-roll apparatus including one or more rollers to convey the web along the web path. The transfer layer 7 may have a thickness of, for example, about 2 mm or less, about 1 mm or less, about 500 microns or less, or about 200 microns or less.

Figure 4B:
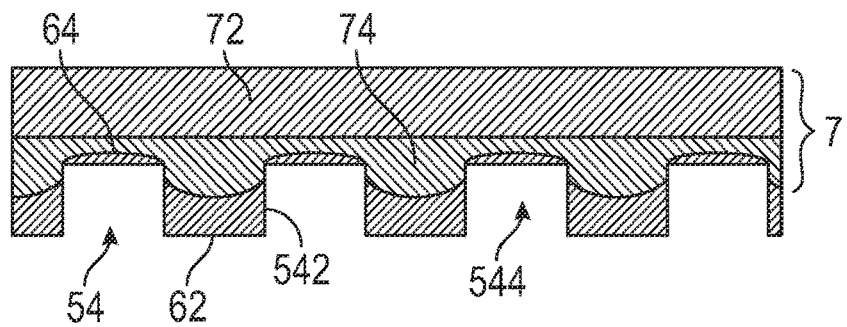
FIG. 4B illustrates a cross-sectional view of the transfer layer of FIG. 4A after being removed along with the solid layer from the patterned surface to form a patterned construction thereon, according to one embodiment.

When the transfer layer 7 is peeled off from the substrate 2, the releasable solid layer 62 and in some embodiments the solidifying product residue 64 can be attached to the adhesive layer 74 and transferred from the patterned layer 4 to the transfer layer 7. FIG. 4B illustrates a cross-sectional view of the transfer layer 7 which forms a patterned construction 54. In the depicted embodiment, the patterned construction 54 can be a negative relief of the patterned surface 40 of FIG. 1A. The patterned construction 54 includes protrusive features 542 which correspond to the recessed features 42 of the patterned surface 40 of FIG. 1A, and recesses 544 which correspond to the plateau features 44 of FIG. 1A. The protrusive features 542 has a top portion including the releasable solid layer 62, and a bottom potion including the material of the adhesive layer 74. The solidifying product residue 64 is attached to the bottom surface of the recesses 544. It is to be understood that the release coating 46 (see FIG. 1B) may be at least partially transferred along the solid layer 62 and the solidifying product residue 64 from the patterned layer 4 to the transfer layer 7, covering the solid layer 62 and the solidifying product residue 64, respectively.

Figure 7:
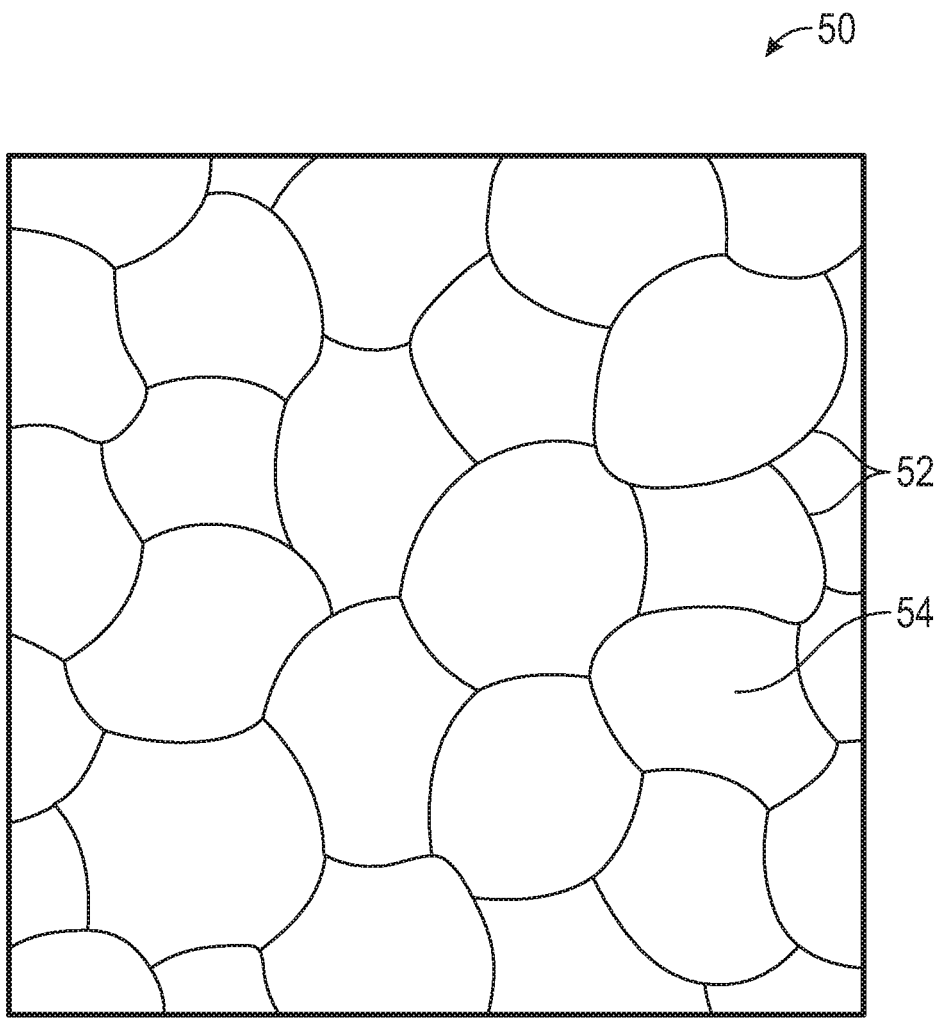
FIG. 7 is a top plan view of a schematic of a metal pattern on a substrate, according to one embodiment.

In some embodiments, the recesses 544 may form a mesh configuration such as the mesh 52 shown in FIG. 7. A mesh described herein is typically understood to mean a pattern geometry having connected traces that are separated by open area to form cells. Illustrative examples of meshes with linear traces include, for example, those having hexagonal and square cells. The recesses 544 can have an average line width in a range, for example, about 50 nm to about 5 microns, and an average depth in a range, for example about 50 nm to about 5 microns.

Figure 5A:
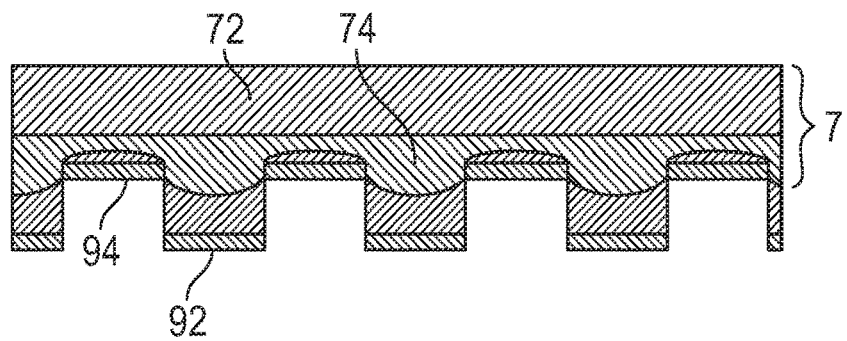
FIG. 5A illustrates a process of providing a metal layer on the patterned construction of FIG. 4B, according to one embodiment.

A metal layer can be provided onto the patterned construction of the transfer layer. FIG. 5A illustrates a cross-sectional view of a metal layer on the patterned construction 54 of FIG. 4B, according to one embodiment. The metal layer includes a first portion 92 disposed on the top surface of the protrusive features 542, and a second portion 94 disposed on the bottom surface of the recesses 544.

The layer of metal can be formed by any desired process including, for example, evaporating, sputtering, e-beam deposition, physical vapor deposition, chemical vapor deposition, liquid coating, etc. In some embodiments, the metal layer may include multiple layers, for example, including a tie-layer (e.g., nickel or titanium) to be in direct contact to the patterned surface, and a layer of another metal (e.g., copper, silver, gold, aluminum, etc.) on top of the tie-layer.

As illustrated in FIG. 5A, the first portion 92 and the second portion 94 of the metal layer are disconnected with each other. That is, the metal layer is not conformally formed on the sides of the protrusive features 542. It is to be understood that the metal layer may be formed at least partially on the sides of the protrusive features 542 with a decreased thickness.

In some embodiments, the metal layer 94 in the recesses 544 can have an average thickness of, for example, about 0.01 to about 2 micrometers, about 0.02 to about 1 micrometer, or about 0.025 to about 0.5 micrometers. In some embodiments, the metal layer 94 in the recesses 544 can be continuous, have one or more surfaces conformal with the surface morphology of the bottom surfaces of the recesses 544, and have a generally uniform thickness. In some embodiments, the metal layer 94 may have a non-uniform thickness.

Figure 5B:
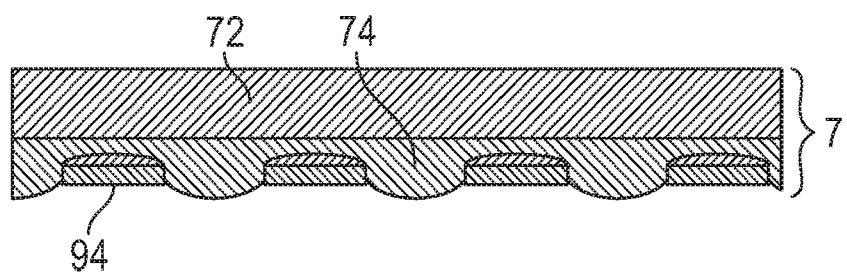
FIG. 5B illustrates a process of removing the solid layer along with the metal layer thereon from the pattern construction of FIG. 5A, according to one embodiment.

After the formation of metal layer on the transfer layer 7, a lift-off process can be performed to remove the solid layer 62 on the protrusive features 542 along with the metal layer 92 thereon. In some embodiments, the solid layer 62 can be a water-soluble polymer layer that can be removed from the transfer layer 7 by, for example, pressure washing. When the solid layer 62 includes poly(vinyl alcohol) (PVA), the solid layer 62 can be dissolved and released from the substrate by water washing. In some embodiments, the solid layer 62 can be removed by peeling. In one embodiment, a curable resin layer can be overcast on the transfer layer 7. The curable resin layer can be cured and peeled from the patterned construction 54 along with the metal layer and the solid layer on the protrusive features. FIG. 5B is a cross-sectional view of the remaining metal pattern 94 in the recesses 544.

In some embodiments, the solidifying product residue 64 remaining in the recesses 544 of the transfer layer 7 (see, e.g., FIG. 4B) can be removed before providing a metal layer onto the transfer layer 7. In the depicted embodiment of FIG. 6A, the solidifying product residue 64 has been removed from the bottom surface of the recesses 544 by etching Any suitable etching processes can be used, including, for example, reactive ion etching (RIE) such as oxygen or oxtafluoropropane plasma etching.

In some embodiments, the etching can first remove the release coating 46 on the surface (if applicable), and continue to remove the underneath solidifying product residue 64 to expose the bottom surface of the recesses 544. The etching can also slightly reduce the thickness of the solid layer 62 of the protrusive features 522. In some embodiments, the thickness of the solid layer 62 can be reduced by, e.g., less than 20%, less than 10%, or less than 5%.

Figure 6A:
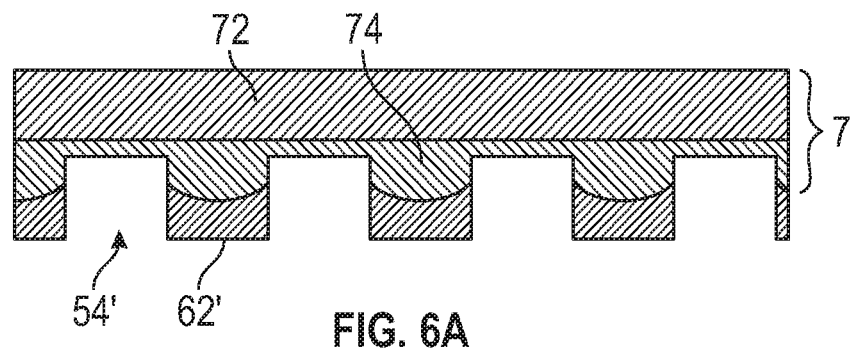
FIG. 6A illustrates a process of etching the patterned surface of FIG. 4B, according to one embodiment.
Figure 6B:
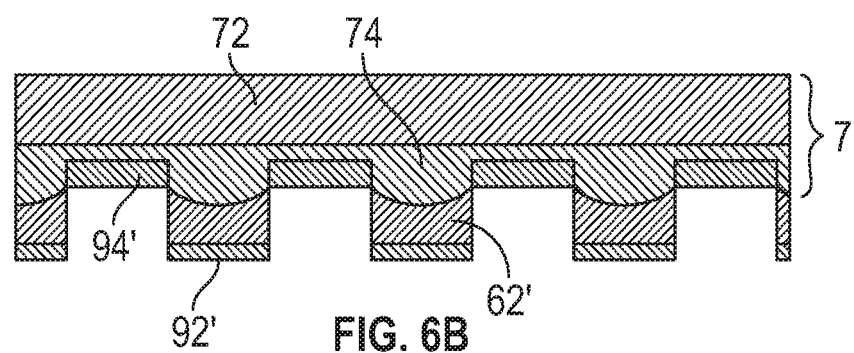
FIG. 6B illustrates a process of providing a metal layer onto the patterned surface of FIG. 6A, according to one embodiment.
Figure 6C:
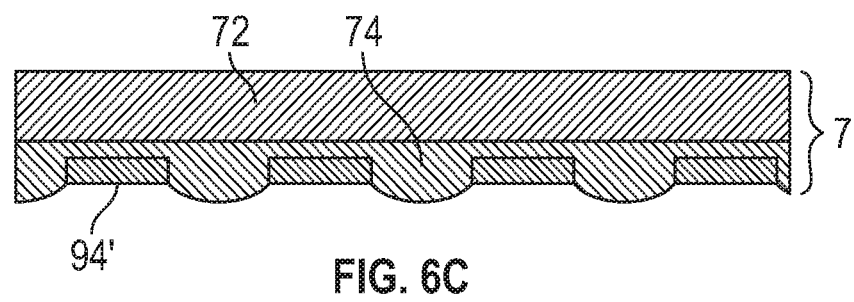
FIG. 6C illustrates a process of removing the solid layer along with the metal layer thereon of FIG. 6B, according to one embodiment.

After the etching, a metal layer can be provided onto the patterned construction 54' of FIG. 6A. FIG. 6B illustrates a process of providing a metal layer to cover the patterned construction 54' of FIG. 6A, according to one embodiment. A first portion 92' of the metal layer is disposed on the solid layer 62 of the protrusive features; and a second portion 94' of the metal layer is directly disposed on the bottom surface of the recesses 544'. A lift-off process can be performed to remove the solid layer 62' along with the metal layer 92' thereon from the transfer layer 7. FIG. 6C is a cross-sectional view of the metal pattern 94' in the recesses 544' of the transfer layer 7.

The metal patterns described herein (e.g., 84 in FIG. 2B, 84' in FIG. 3C, 94 in FIG. 5B, 94' in FIG. 6C) can be applied to various devices. In some embodiments, the metal patterns can be disposed only on plateau features of a patterned surface to form a mesh shape on a flexible substrate. In some embodiments, the metal patterns can be disposed only in recesses of a patterned surface to form a mesh shape on a flexible substrate. The metal pattern can have a thickness, for example, about 20 nm to 500 nm. In some embodiments, the flexible substrate having the patterned surface that supports the metal pattern can be transparent. In some embodiments, the patterned surface with the metal pattern can be back-filled with a material that is index-matched to the top layer of the structured layer. Exemplary backing filling materials were described in U.S. Pat. No. 8,703,232 (Stay et al.), which is incorporated herein by reference.

While the above description provides a mesh pattern of metal or other electrically conductive materials on a flexible substrate, it is to be understood that a pattern of other materials can be formed on the flexible substrate in similar manners. For example, the materials for such a pattern may include ceramics, inks, or any suitable optical materials. Also, similar processes/methods can be used to make suitable patterns other than a mesh on a flexible substrate.

The processes described herein, such as, for example, micro-replication, plasma coating, etching, coating, solidifying/drying, laminating, peeling, metal deposition (e.g., sputtering), metal evaporation, etc., can be performed in a continuous or roll-to-roll manner. Exemplary continuous or roll-to-roll micro-replication processes were described in U.S. Pat. No. 9,759,663 (Halverson et. al.). Exemplary continuous or roll-to-roll processes of plasma coating and etching were described in U.S. Pat. No. 8,460,568 (David et. al.). Exemplary continuous or roll-to-roll processes of coating and drying were described in U.S. Pat. No. 8,623,140 (Yapel et al). Lamination and stripping of webs can be added after the coating step. Exemplary continuous or roll-to-roll processes of metal deposition were described in U.S. Pat. No. 6,172,810 (Fleming et al).

Exemplary embodiments of the present disclosure may take on various modifications and alterations without departing from the spirit and scope of the present disclosure. Accordingly, it is to be understood that the embodiments of the present disclosure are not to be limited to the following described exemplary embodiments, but is to be controlled by the limitations set forth in the claims and any equivalents thereof.

LISTING OF EXEMPLARY EMBODIMENTS

It is to be understood that any one of embodiments 1-16, 17-27 and 28-30 can be combined. Embodiment 1 is a method of forming a metal pattern on a flexible substrate, the method comprising:
- providing a patterned surface on the flexible substrate, the patterned surface including one or more recessed features and one or more plateau features adjacent to the recesses;
- coating the patterned surface with a liquid solution to at least partially fill the recessed features;
- solidifying the liquid solution to form a releasable solid layer in the recessed features;
- etching the patterned surface after solidifying the liquid solution;
- providing a metal layer to cover the etched patterned surface; and
- removing the solid layer along with the metal layer thereon in the recessed features from the flexible substrate to form a metal pattern on the plateau features of the flexible substrate.

Embodiment 2 is the method of embodiment 1, further comprising treating the patterned surface to form a release coating thereon before coating the liquid solution.

Embodiment 3 is the method of embodiment 1 or 2, wherein the liquid layer also covers the plateau features on the patterned surface.

Embodiment 4 is the method of any one of embodiments 1-3, wherein a solidifying product residue remains on the plateau features after the solidifying, the solidifying product residue has a dry thickness that is at most ½ the thickness of the solid layer in the recessed features.

Embodiment 5 is the method of embodiment 4, wherein the solidifying product residue has a dry thickness of about 200 nm or less.

Embodiment 6 is the method of any one of embodiments 2-5, wherein the etching is capable of removing or modifying the release coating.

Embodiment 7 is the method of any one of embodiments 1-6, wherein the metal layer is provided by sputtering deposition with a tie layer.

Embodiment 8 is the method of any one of embodiments 1-7, wherein removing the solid layer further comprises overcoating a curable resin on the metal layer and curing the curable resin to form a cured resin layer.

Embodiment 9 is the method of embodiment 8, further comprising peeling the cured resin layer to remove the solid layer along with the metal layer thereon in the recessed features from the flexible substrate.

Embodiment 10 is the method of any one of embodiments 1-9, wherein providing a patterned surface on the flexible substrate comprises forming micro-replicated features on the flexible substrate.

Embodiment 11 is the method of embodiment 9, wherein the micro-replicated features are formed on a patterned surface layer of the flexible substrate.

Embodiment 12 is the method of any one of embodiments 2-10, wherein the release coating is formed by a plasma deposition process using hexamethyldisiloxane (HMDSO).

Embodiment 13 is the method of any one of embodiments 1-12, wherein the liquid solution comprises poly(vinyl alcohol) (PVA).

Embodiment 14 is the method of any one of embodiments 1-13, wherein the metal pattern on the plateau features of the flexible substrate forms a mesh shape having an open area greater than 95%.

Embodiment 15 is the method of any one of embodiments 1-14, wherein the patterned surface with the metal pattern thereon is back-filled with a material that is index-matched to the patterned surface.

Embodiment 16 is a device made according to the method of any one of embodiments 1-15, the device comprising:
- the flexible substrate;
- the metal pattern disposed only on a top surface of the plateau features to form a mesh shape on the flexible substrate,
- wherein the plateau features have an average line width of about 50 nm to about 5 microns, and an average height of about 50 nm to about 5 microns.

Embodiment 17 is a method of forming a metal pattern, the method comprising:
- providing a patterned surface, the patterned surface including one or more recessed features and one or more plateau features adjacent to the recesses;
- coating the patterned surface with a liquid solution to at least partially fill the recesses;
- solidifying the liquid solution to form a releasable solid layer in the recesses;
- providing a transfer layer to adhere to the patterned surface;
- removing the transfer layer from the patterned surface to form a patterned construction on the transfer layer, the solid layer being transferred from the patterned surface to the transfer layer and forming one or more plateau features of the patterned construction;

providing a metal layer on the patterned construction of the transfer layer; and removing the solid layer along with the metal layer thereon from the pattern construction to form a metal pattern on the transfer layer.

Embodiment 18 is the method of embodiment 17, further comprising treating the patterned surface to form a release coating thereon.

Embodiment 19 is the method of embodiment 17 or 18, wherein the transfer layer comprises an adhesive layer which is a curing product of a curable liquid that is applied onto the patterned surface.

Embodiment 20 is the method of embodiment 19, wherein the transfer layer further comprises a flexible backing layer to support the adhesive layer.

Embodiment 21 is the method of any one of embodiments 17-20, further comprising etching the patterned surface before providing the transfer layer.

Embodiment 22 is the method of any one of embodiments 17-21, further comprising etching the patterned construction before providing the metal layer on the patterned construction.

Embodiment 23 is the method of any one of embodiments 17-22, wherein the metal layer is provided by sputtering deposition with a tie layer.

Embodiment 24 is the method of any one of embodiments 17-23, wherein the solid layer and the metal layer thereon are removed by water washing.

Embodiment 25 is the method of any one of embodiments 17-24, wherein the solid layer and the metal layer thereon are removed by peeling.

Embodiment 26 is the method of any one of embodiments 17-25, wherein the patterned surface with the metal pattern thereon is back-filled with a material that is index-matched to the patterned surface.

Embodiment 27 is a device made according to the method of any one of embodiments 17-26, the device comprising:

the transfer layer having a patterned surface, the patterned surface including one or more recessed and one or more protrusive features adjacent to the recesses; and the metal pattern disposed only in the recesses to form a mesh shape, wherein the recesses have an average line width of about 50 nm to about 5 microns, and an average depth of about 50 nm to about 5 microns.

Embodiment 28 is a method of forming an electrically conductive mesh pattern on a flexible substrate, the method comprising:

providing a patterned surface including recesses and plateau features, the plateau features forming a mesh pattern;

coating a patterned surface with a liquid solution to at least partially fill the recesses;

solidifying the liquid solution to form a releasable solid layer, wherein the releasable solid layer has a thickness in the recesses at least 2 times, at least 5 times of times, or at least 10 times thicker than that on the plateau features.

Embodiment 29 is the method of embodiment 28, further comprising providing a metal layer to cover the patterned surface; and removing the solid layer along with the metal layer thereon in the recesses to form a mesh metal pattern on the plateau features.

Embodiment 30 is the method of embodiment 28, further comprising:

providing a transfer layer to adhere to the patterned surface;

removing the transfer layer from the patterned surface to form a patterned construction on the transfer layer, the solid layer being transferred from the patterned surface to the transfer layer and forming one or more plateau features of the patterned construction;

providing a metal layer on the patterned construction of the transfer layer; and removing the solid layer along with the metal layer thereon from the pattern construction to form a mesh metal pattern on the transfer layer.

The operation of the present disclosure will be further described with regard to the following detailed examples. These examples are offered to further illustrate the various specific and preferred embodiments and techniques. It should be understood, however, that many variations and modifications may be made while remaining within the scope of the present disclosure.

EXAMPLES

These Examples are merely for illustrative purposes and are not meant to be overly limiting on the scope of the appended claims. Notwithstanding that the numerical ranges and parameters setting forth the broad scope of the present disclosure are approximations, the numerical values set forth in the specific examples are reported as precisely as possible. Any numerical value, however, inherently contains certain errors necessarily resulting from the standard deviation found in their respective testing measurements. At the very least, and not as an attempt to limit the application of the doctrine of equivalents to the scope of the claims, each numerical parameter should at least be construed in light of the number of reported significant digits and by applying ordinary rounding techniques.

Summary of Materials

Unless otherwise noted, all parts, percentages, ratios, etc. in the Examples and the rest of the specification are by weight. Table 1 provides abbreviations and a source for all materials used in the Examples below:

TABLE 1

| Abbreviation | Description | Source |
|---|---|---|
| PVA | Polyvinyl alcohol 9,000-10,000 MW 80% hydrolyzed | Sigma-Aldrich Chemiacl Company, Milwaukee, WI |
| Mel454 | DuPont Tejin Films Melinex ™ 454 polyester film (50.8 um thick) | DuPont, Wilmington, DE |
| COP | Cyclic olefin copolymer film Zeonor ZF16-100 | Zeon Chemicals, Louisville, KY |
| Tergitol | Tergitol ™ 15-s-7 | Sigma-Aldrich Chemiacl Company, Milwaukee, WI |
| HMDSO | Hexamethyldisiloxane | Sigma-Aldrich Chemiacl Company, Milwaukee, WI |

Solution Mixtures

"Mixture 1" is a combination of 75 wt % of an aliphatic urethane diacrylate, 25 wt % of a diacrylate and 0.5% photoinitiator.

"Mixture 2" is a solution of 3-10% PVA, 10% isopropyl alcohol, 0.05% Tergitol in DI water.

Substrates

Two types of patterned surfaces were used. Both patterned surfaces were formed by roll-to-roll microreplication. Mel 454 was coated with Mixture 1, nipped against a structured tool, cured using ultra-violet lights, and then peeled from the tool.

A first pattern is a "pseudorandom curved" pattern depicted in FIG. 7. The lines in the figure represent features which have almost vertical side-walls, are 2 microns tall and 2 microns wide. The average pitch of the cells is 200 microns.

A second pattern is a hexagonal pattern depicted in FIG. 1 of U.S. Patent Publication NO. 2013/0306359. The lines in the figure represent features which are 2 microns tall, 2 microns wide at the peak, and 4 microns wide at the base. The pitch of the hexagons is 200 microns.

Coating and Etching Methods

Onto the patterned surface, layer(s) were added or reduced using known coating and etching techniques.

A plasma coating technique was used to deposit Hexamethyldisiloxane (HMDSO). Here, the surface was release coated with using a home-built parallel plate capacitively coupled plasma reactor. The chamber has a central cylindrical powered electrode with a surface area of 18.3 ft². After placing the structured film on the powered electrode, the reactor chamber was pumped down to a base pressure of less than 1.3 Pa (2 mTorr). HMDSO was evaporated into the chamber through a ½ tube without restriction. Treatment was carried out using a plasma enhanced CVD method by coupling RF power into the reactor at a frequency of 13.56 MHz and an applied power of 2000 watts. Treatment time was controlled by moving the micro-structured film through the reaction zone at a rate of 30 feet per minute.

A die coating technique is a roll-to-roll technique used to deposite a liquid solution. The solutions were coated at 10 feet per minute using a slot die and dried in an oven approximately 6 m long between 70° C. and 110° C. Solution concentration and feed rate was adjusted to achieve the correct dry thickness.

A Meyer rod technique was used to coat a solution on a piece part sample. Solution concentration and Meyer rod were adjusted to achieve the correct dry thickness. These solutions were allowed to dry at room temperature.

Known vacuum sputtering methods were used to deposite "sputtered" silver. Known electron beam evaporating methods were used to deposit silver by evaporation. A 10 nm Cr layer was deposited as a tie layer for both methods. These systems can be run as either batch or roll-to-roll.

A batch etching method was used to etch piece-part samples. A vacuum was pulled in a Plasmatherm Model 3032 capacitive plasma reactor and oxygen was flowed in at a rate of 500 standard cubic centemeters per minute. The reactor power was set to 1350 watts. The amount that was etched was controlled by adjusting the time the reactor is on.

A roll-to-roll etching method was used to continuously etch. Samples were the etched in a home-built chamber that has a web path of approximately 3 meters. The speed of the web and the number of passes was adjusted to change the residence time in the reactor. Octafluoropropane was flowed in at a rate of 250 standard cubic centimeter per minute and oxygen was flowed in at a rate of 750 standard cubic centimeter per minute. The reactor power was set to 6000 watts.

Test Methods

The following test methods have been used in evaluating some of the Examples of the present disclosure. Transmittance, haze and clarity were measured with a BYK-Gardner haze-gard plus. Conductivity was measured using a two-point probe between two lines painted with TEC-PR-041 (Ink Tec Inc. Newton, NC) or with a custom-built probe with two one-centimeter contacts separated by one centimeter. Microscope images were obtained using an Olympus MX61L.

TABLE 1

| Example number | Pattern | Plasma Coating | PVA dry thickness (um) | Etch time (s) | Metal thickness (nm) | Metal deposition method | Release method |
|---|---|---|---|---|---|---|---|
| 1 | pseudorandom curved | Y | 0.5 | 0 | 200 | Sputter | Peel |
| 2 | pseudorandom curved | Y | 0.5 | 0 | 200 | Sputter | Ultrasonic wash |
| 3 | Hexagonal | Y | 1 | 30 | 200 | Sputter | Peel |
| 4 | Hexagonal | Y | 1 | 30 | 200 | Sputter | Peel |
| 5 | Hexagonal | Y | 1 | 30 | 200 | Sputter | Peel |
| 6 | Hexagonal | Y | 0.5 | 0 | 200 | Sputter | Peel |
| 7 | Hexagonal | N | 1 | 30 | 200 | Sputter | Peel |

EXAMPLES

The following illustrate Examples of the preparation of various release coatings on patterned surfaces according to the present disclosure, as well as Comparative Example(s).

Example 1

A pseudorandom curved pattern was plasma coated with HDMSO. Mixture 2 was die coated to a dry thickness of 0.5 microns. Silver was sputtered in a batch process to a thickness of 200 nanometers. The silver layer was laminated to Mel454 with Mixture 1, then cured with ultraviolet light, then peeled to remove the solid layer from the recessed features.

Example 2

A pseudorandom curved pattern was plasma coated with HDMSO. Mixture 2 was die coated to a dry thickness of 0.5 microns. Silver was sputtered in a batch process to a thickness of 200 nanometers. The substrate was placed under an ultrasonic horn for 10 seconds to remove the solid layer.

Example 3

A hexagonal pattern was plasma coated with HDMSO. Mixture 2 was die coated to a dry thickness of 1 micron. The patterned surface was roll-to-roll etched for 30 seconds.

Silver was sputtered in a roll-to-roll process to a thickness of 200 nanometers. The silver layer was laminated to Mel454 with Mixture 1, then cured with ultraviolet light, then peeled to remove the solid layer from the recessed features.

Example 4

The metalized pattern from example 1.2 was back-filled with Mixture 1, laminated to COP, and cured with ultraviolet light.

Example 5

A hexagonal pattern was plasma coated with HDMSO. Mixture 2 was Meyer rod coated to a dry thickness of 1 microns. The pattern was etched in a batch process for 30 seconds. Silver was sputtered in a batch process to a thickness of 200 nanometers. The silver layer was laminated to Mel454 with Mixture 1, then cured with ultraviolet light, then peeled to remove the solid layer from the recessed features.

Comparative Example 6

A hexagonal pattern was plasma coated with HDMSO. Mixture 2 was die coated to a dry thickness of 0.5 microns. Silver was sputtered in a batch process to a thickness of 200 nanometers. The silver layer was laminated to Mel454 with Mixture 1, then cured with ultraviolet light, then peeled to remove the solid layer from the recessed features.

Comparative Example 7

Mixture 2 was Meyer rod coated to a dry thickness of 1 microns on a hexagonal pattern. The pattern was etched in a batch process for 30 seconds. Silver was sputtered in a batch process to a thickness of 200 nanometers. The silver layer was laminated to Mel454 with Mixture 1, then cured with ultraviolet light, then peeled to remove the solid layer from the recessed features.

TABLE 2

| Example number | Pattern | Plasma coating | PVA dry thickness (um) | Lamination resin | Etch time | Metal thickness (um) | Metal deposition method | Release method |
|---|---|---|---|---|---|---|---|---|
| 8 | Hexagonal | Y | 2 | Mixture 1 | 30 | 200 | Sputter | Peel |
| 9 | Hexagonal | Y | 2 | Mixture 1 | 0 | 200 | Sputter | Peel |

Example 8

A hexagonal pattern was plasma coated with HDMSO. Mixture 2 was die coated to a dry thickness of 2 microns. The pattern was transferred to Mel454 by coating Mixture 1, curing with ultraviolet light, then peeling. The patterned construction was etched in a batch process for 30 seconds. Silver was sputtered in a batch process to a thickness of 200 nanometers. The silver layer was laminated to Mel454 with Mixture 1, then cured with ultraviolet light, then peeled to remove the solid layer from the recessed features.

Comparative Example 9

A hexagonal pattern was plasma coated with HDMSO. Mixture 2 was die coated to a dry thickness of 2 microns. The pattern was transferred to Mel454 by coating Mixture 1, curing with ultraviolet light, then peeling. Silver was sputtered in a batch process to a thickness of 200 nanometers. The silver layer was laminated to Mel454 with Mixture 1, then cured with ultraviolet light, then peeled to remove the solid layer from the recessed features.

Characteristics of the Articles

Transmittance, haze, clarity and conductivity are reported for Examples 1-7 in Table 3.

TABLE 3

| Example number | Transmittance | Haze | Clarity | Conductivity (Ohms/sq) |
|---|---|---|---|---|
| 1 | 85.7 | 5.71 | 97.8 | 130 |
| 2 | 91 | 5.15 | 98.8 | 370 |
| 3 | 91.8 | 6.01 | 97.2 | 20 |
| 4 | 90.7 | 1.7 | 99.4 | 20 |
| 5 | 91.8 | 4.09 | 98.1 | 15 |
| 6 | 93.4 | 7.02 | 97.2 | 0 |
| 7 | 90.6 | 6.66 | 97.1 | 0 |

Figure 8:
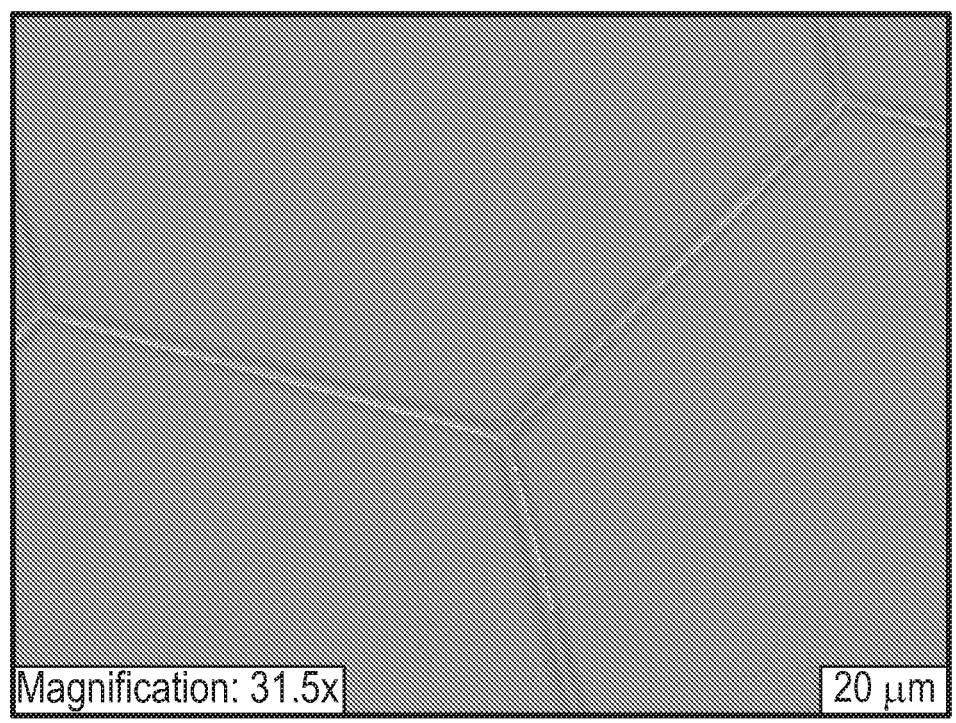
FIG. 8 illustrates a microscopic image of Example 8.
Figure 9:
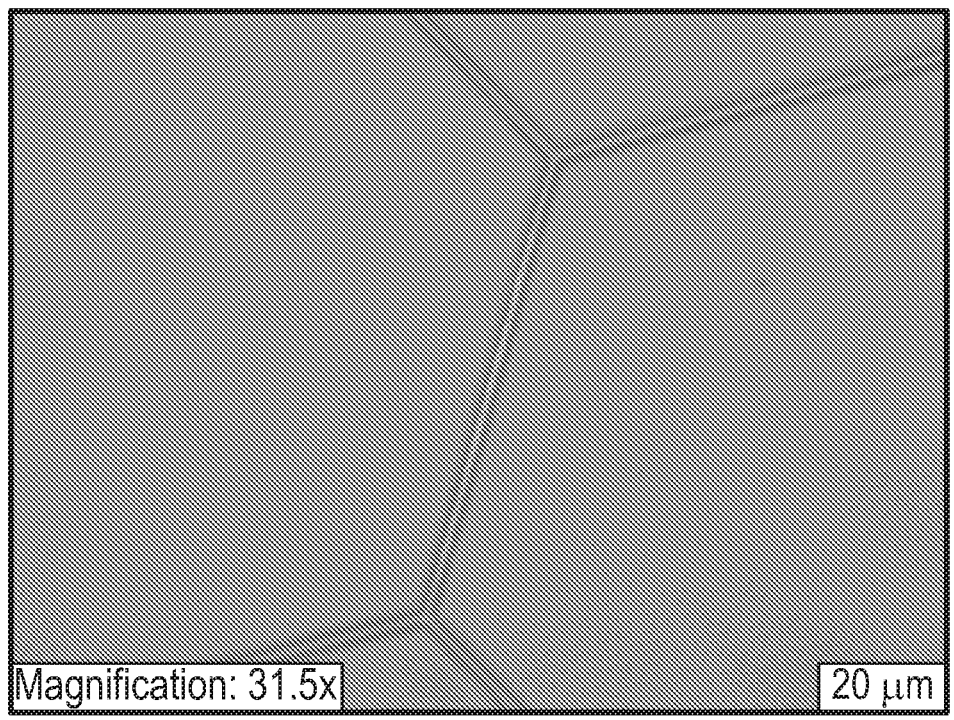
FIG. 9 illustrates a microscopic image of Example 9.

Neither samples from Examples 8 or 9 were conductive, but it can be seen by the micrographs shown in FIGS. 8 and 9, that Example 8 contained more metal on the traces.

Reference throughout this specification to "one embodiment," "certain embodiments," "one or more embodiments" or "an embodiment," whether or not including the term "exemplary" preceding the term "embodiment," means that a particular feature, structure, material, or characteristic described in connection with the embodiment is included in at least one embodiment of the certain exemplary embodiments of the present disclosure. Thus, the appearances of the phrases such as "in one or more embodiments," "in certain embodiments," "in one embodiment" or "in an embodiment" in various places throughout this specification are not necessarily referring to the same embodiment of the certain exemplary embodiments of the present disclosure. Furthermore, the particular features, structures, materials, or characteristics may be combined in any suitable manner in one or more embodiments.

While the specification has described in detail certain exemplary embodiments, it will be appreciated that those skilled in the art, upon attaining an understanding of the foregoing, may readily conceive of alterations to, variations of, and equivalents to these embodiments. Accordingly, it should be understood that this disclosure is not to be unduly limited to the illustrative embodiments set forth hereinabove. In particular, as used herein, the recitation of numerical ranges by endpoints is intended to include all numbers subsumed within that range (e.g., 1 to 5 includes 1, 1.5, 2, 2.75, 3, 3.80, 4, and 5). In addition, all numbers used herein are assumed to be modified by the term "about."

Furthermore, all publications and patents referenced herein are incorporated by reference in their entirety to the same extent as if each individual publication or patent was specifically and individually indicated to be incorporated by reference. Various exemplary embodiments have been described. These and other embodiments are within the scope of the following claims.

What is claimed is:

1. A method of forming a metal pattern on a flexible substrate, the method comprising:
   providing a patterned surface on the flexible substrate, the patterned surface including one or more recessed features and one or more plateau features adjacent to the recesses;
   treating the patterned surface to form a release coating thereon,
   coating a liquid solution on the release coating on the patterned surface to at least partially fill the recessed features and to cover the plateau features;
   solidifying the liquid solution to form a releasable solid layer in the recessed features and a solidified product residue on the plateau features, wherein the solidified product residue has a dry thickness at most one-half the thickness of the releasable solid layer in the recessed features;
   etching the patterned surface after solidifying the liquid solution to remove the solidified product residue from the plateau features;
   providing a metal layer to cover the etched patterned surface; and
   removing the releasable solid layer along with the metal layer thereon in the recessed features from the flexible substrate to form a pattern of the metal layer on the plateau features of the flexible substrate;
   wherein etching the patterned surface after solidifying the liquid solution further comprises chemically modifying the release coating on the plateau features to increase adhesion to the metal layer.

2. The method of claim 1, wherein removing the solid layer further comprises overcoating a curable resin on the metal layer and curing the curable resin to form a cured resin layer; and separating the cured resin layer from the flexible substrate to remove the releasable solid layer along with the metal layer thereon in the recessed features from the flexible substrate.

3. The method of claim 1, wherein providing a patterned surface on the flexible substrate comprises forming micro-replicated features on the flexible substrate.

4. The method of claim 1, wherein the release coating is formed by a plasma deposition process using hexamethyldisiloxane (HMDSO).

5. The method of claim 1, wherein the liquid solution comprises poly(vinyl alcohol) (PVA).

6. The method of claim 1, wherein the metal pattern on the plateau features of the flexible substrate forms a mesh shape having an open area greater than 95%.

7. The method of claim 1, wherein the patterned surface with the metal pattern thereon is back-filled with a material that is index-matched to the patterned surface.

* * * * *